(12) United States Patent
Chen et al.

(10) Patent No.: US 6,307,239 B1
(45) Date of Patent: Oct. 23, 2001

(54) CMOS SENSE STRUCTURE HAVING SILICON DIOXIDE OUTER RING AROUND SENSE REGION

(75) Inventors: Ming-I Chen, Tainan Hsien; Jui-Hsiang Pan, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/560,013

(22) Filed: Apr. 27, 2000

(30) Foreign Application Priority Data

Apr. 19, 2000 (TW) ............................................. 89107355 A

(51) Int. Cl.$^7$ .................................................. H01L 29/76
(52) U.S. Cl. .................... 257/409; 257/349; 257/547; 257/181; 257/355
(58) Field of Search ..................... 257/297, 349, 257/547, 127, 170, 409, 452, 484, 181, 688, 355, 356

(56) References Cited

U.S. PATENT DOCUMENTS

| | | | | |
|---|---|---|---|---|
| 4,180,749 | * | 12/1979 | Sloan | 307/299 |
| 4,228,448 | * | 10/1980 | Lalumia et al. | 357/46 |
| 5,648,665 | * | 7/1997 | Terasawa | 257/136 |
| 5,841,167 | * | 11/1998 | Grimaldi et al. | 257/341 |
| 6,066,884 | * | 5/2000 | Krutsick | 257/484 |
| 6,111,283 | * | 8/2000 | Yang et al. | 257/306 |
| 6,140,694 | * | 10/2000 | Chen et al. | 257/574 |
| 6,150,701 | * | 11/2000 | Lee | 257/409 |
| 6,191,015 | * | 2/2001 | Losehand et al. | 438/570 |

FOREIGN PATENT DOCUMENTS

05129649 * 5/1993 (JP) ...................................... 257/225

* cited by examiner

Primary Examiner—Eddie Lee
Assistant Examiner—Eugene Lee
(74) Attorney, Agent, or Firm—Thomas, Kayden, Horstemeyer & Risley

(57) ABSTRACT

A CMOS structure having a silicon dioxide outer ring around the sense region. The CMOS sense structure has a substrate, a n$^-$ region, a n$^+$ region, an isolation region, a field implant region and a silicon dioxide outer ring region. The n$^-$ region is formed in the substrate, and the n$^+$ region is formed within the n$^-$ region. The isolation region is formed in the substrate next to the edge of the n$^-$ region. The field implant region is formed under the isolation region. The silicon dioxide outer ring region is formed over the n$^-$ region, a portion of the isolation region and a portion of the n$^+$ region. The silicon dioxide outer ring can prevent surface leakage that is caused by etching and lengthening the distance from the n$^-$ region to the field implant region so that edge junction leakage is reduced.

6 Claims, 3 Drawing Sheets

CMOS SENSE STRUCTURE HAVING SILICON DIOXIDE OUTER RING AROUND SENSE REGION

CROSS-REFERENCE TO RELATED APPLICATION

This application claims the priority benefit of Taiwan application serial no. 89107355, filed Apr. 19, 2000.

BACKGROUND OF THE INVENTION

1. Field of Invention

The present invention relates to a CMOS sense structure. More particularly, the present invention relates to a CMOS sense structure having a silicon dioxide outer ring around the sense region for lowering surface leakage and edge junction leakage.

2. Description of Related Art

FIG. 1 is a schematic cross-sectional side view of a conventional CMOS sense structure. As shown in FIG. 1, the CMOS sense structure includes a substrate 10, a $n^+$ region 12, a $n^-$ region 14, isolation regions 16 and field implant regions 18. The substrate 10 can be a P-type substrate (or a P-well), for example. The $n^+$ region 12 and the $n^-$ region 14 are formed by implanting identical ions, but with different concentrations, into the substrate 10. The concentration of ions inside the $n^+$ region is higher than the concentration of ions inside the $n^-$ region. The $n^+$ region 12 and the $n^-$ region 14 together form the diode in the sense region. The isolation region 16 and the field implant region 18 on each side of the sense region are used for isolating device regions (not shown in the figure).

Because etching is conducted in the process of forming spacers or polysilicon gates in the device regions, the depletion region 22 near the edge of the sense region may be etched, leading to surface damages. Consequently, a large dark current may form on the surface of the sense region. The dark current is referred to as surface leakage. An excessive surface leak may result in poor image quality.

SUMMARY OF THE INVENTION

Accordingly, one object of the present invention is to provide a CMOS sense structure having an outer silicon dioxide ring around the sense region. The outer silicon dioxide ring serves as a protective layer to prevent any damages on the depletion region near the edge of the sense region when spacer etching or polysilicon etching is conducted to reduce the leakage current.

To achieve these and other advantages and in accordance with the purpose of the invention, as embodied and broadly described herein, the invention provides a CMOS structure having a silicon dioxide outer ring around the sense region. The CMOS sense structure includes a substrate, a $n^-$ region, a $n^+$ region, an isolation region, a field implant region and a silicon dioxide outer ring region. The $n^-$ region is formed in the substrate, and the $n^+$ region is formed within the $n^-$ region. The isolation region is formed in the substrate next to the edge of the $n^-$ region. The field implant region is formed under the isolation region. The silicon dioxide outer ring region is formed over the $n^-$ region, a portion of the isolation region and a portion of the $n^+$ region.

The substrate can be a P-type substrate. The $n^+$ region and the $n^-$ region form a diode structure. The isolation region is formed using a silicon dioxide. The field implant region is formed by implanting p-type ions. In addition, the silicon dioxide outer ring is formed over the $n^-$ region, a portion of the isolation region and a portion of the $n^+$ region. Hence, the outer ring can protect the depletion region of the sense region against any damages that are caused by etching and reducing the current leak.

The invention also provides a method of forming a CMOS sense structure having a silicon dioxide outer ring around the sense region. First, a substrate having a device region, a plurality of isolation regions and a CMOS sense region is provided. One side of the isolation region is in contact with the device region while the other side of the isolation region is in contact with the CMOS sense region. There is a field implant region under each isolation region. A silicon dioxide outer ring is formed over the isolation region and the edge junction of the CMOS sense region. Finally, an $n^+$ and an $n^-$ implant are conducted sequentially, implanting ions into the CMOS sense region.

The substrate can be a P-type substrate. The $n^+$ region and the $n^-$ region form a diode structure. The isolation region is formed using a silicon dioxide. The field implant region is formed by implanting p-type ions. In this invention, since the silicon dioxide outer ring is formed before the $n^+$ and $n^-$ implants, distance of separation between the $n^+/n^-$/field implant regions is increased. Hence, edge junction leakage is lowered.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
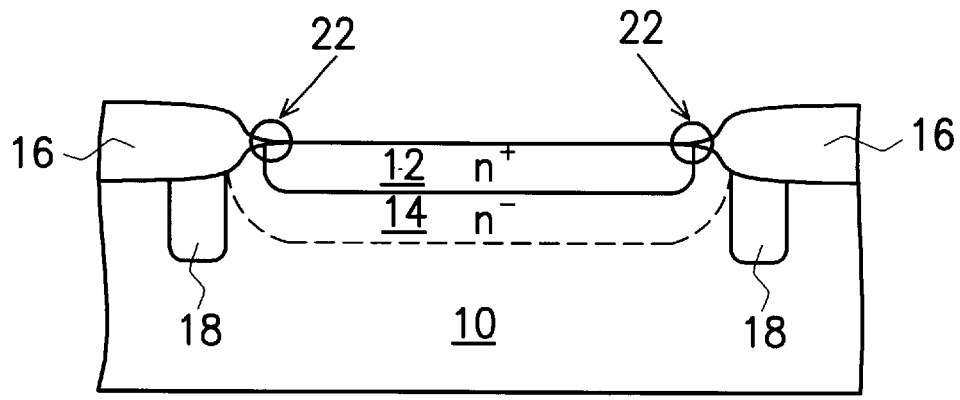
FIG. 1 is a schematic cross-sectional side view of a conventional CMOS sense structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
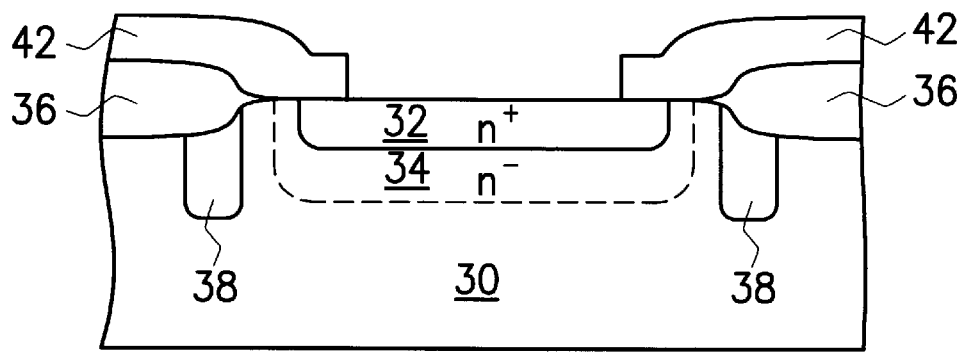
FIG. 2A is a schematic cross-sectional view showing a CMOS sense structure having a silicon dioxide outer ring thereon according to a preferred embodiment of this invention.
Figure 2B:
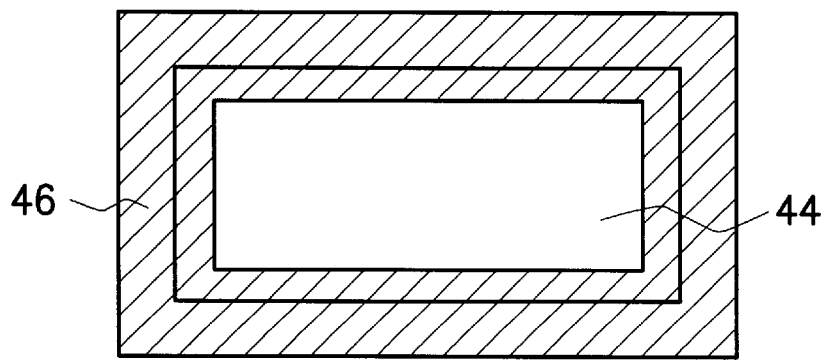
FIG. 2B is a schematic top view of the CMOS sense structure shown in FIG. 2A.

FIG. 2A is a schematic cross-sectional view showing a CMOS sense structure having a silicon dioxide outer ring thereon according to a preferred embodiment of this invention. FIG. 2B is a schematic top view of the CMOS sense structure shown in FIG. 2A.

As shown in FIG. 2A, a CMOS sense structure includes a substrate 30, a $n^+$ region 32, a $n^-$ region 34, isolation regions 36, field implant regions 38 and a silicon dioxide outer ring 42. The substrate 30 can be a P-type substrate or a P-well above a substrate, for example. The $n^+$ region 32 and the n⁻ region 34 are formed within the substrate 30, and the n⁺ region 32 is formed entirely within the n⁻ region 34. Although identical types of ions are implanted into the n⁺ region 32 and the n⁻ region 34, the concentrations of the ions in the implanted regions 32 and 34 are different. In general, the concentrations of the ions in the n⁺ region is greater than the concentration of ions in the n⁻ region. Due to a difference in the concentrations of the ions, the n⁺ region 32 and n⁻ region 34 together form the diode of the sense structure.

The isolation regions 36 and the field implant regions 38 are structures for isolating different device regions. The isolation region 36 is a silicon dioxide layer formed over the substrate 30. The isolation region 36 is in contact with the edge of the n⁻ region 34. The field implant region 38 is under the isolation region 36 and is formed by a P-type ion implant. The silicon dioxide outer ring 42 is formed over the entire n⁻ region 34, a portion of the isolation region 36 and a portion of the n⁺ region 32. As shown in FIG. 2B, the central portion 44 is the sense region of the n⁻ region 34 and the n⁺ region 32, and the outer ring 46 is the region covered by the silicon dioxide outer ring 42.

FIGS. 3A through 3F are schematic cross-sectional views showing the progression of steps for producing the CMOS sense structure of this invention.

Figure 3A:
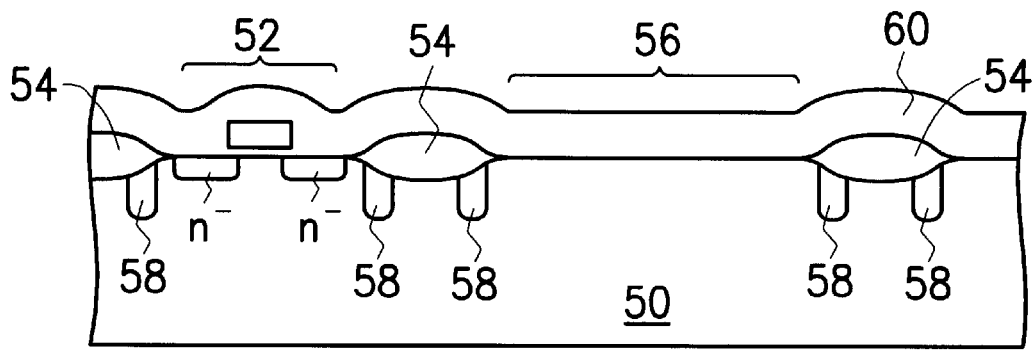
FIGS. 3A through 3F are schematic cross-sectional views showing the progression of steps for producing the CMOS sense structure of this invention.

As shown in FIG. 3A, a substrate of a P-well 50 having a device region 52, a plurality of isolation regions 54 and a CMOS sense region 56 is provided. One side of the isolation region 54 is in contact with the device region 52, while the other side of the isolation region 54 is in contact with the CMOS sense region 56. There is a field implant region 58 under the isolation region 54. To prepare for the formation of spacers, a silicon dioxide layer 60 is formed by APCVD or PECVD after source/drain implant in the device region 52.

Figure 3B:
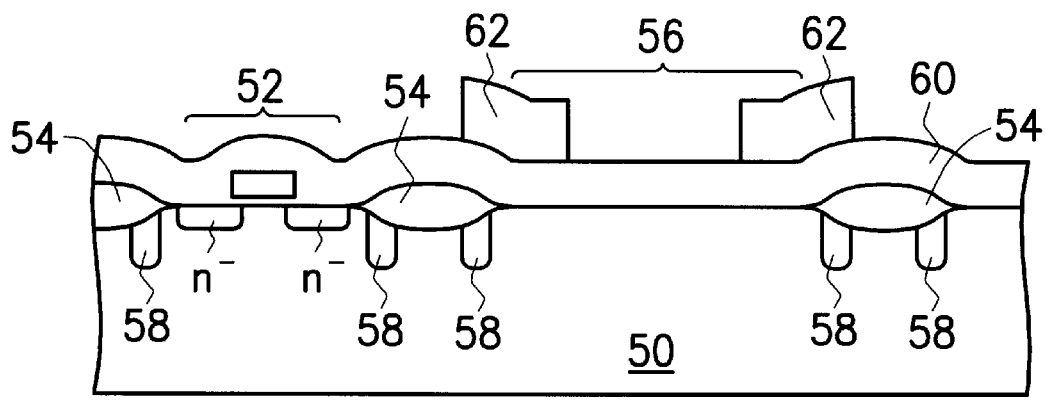
Figure 3C:
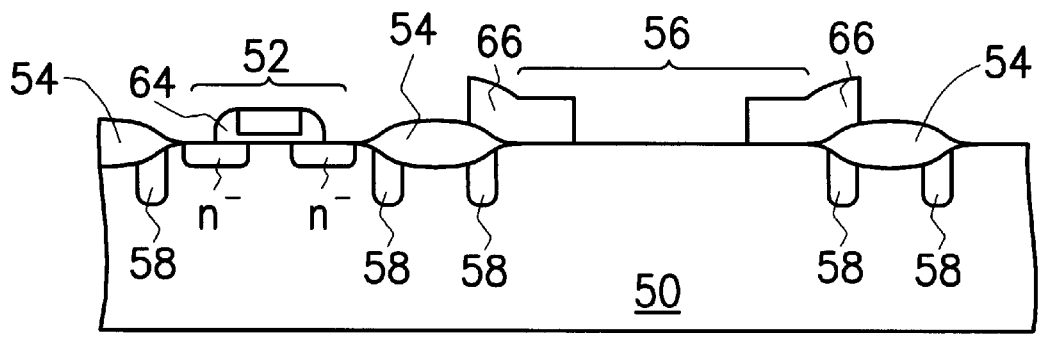
Figure 3D:
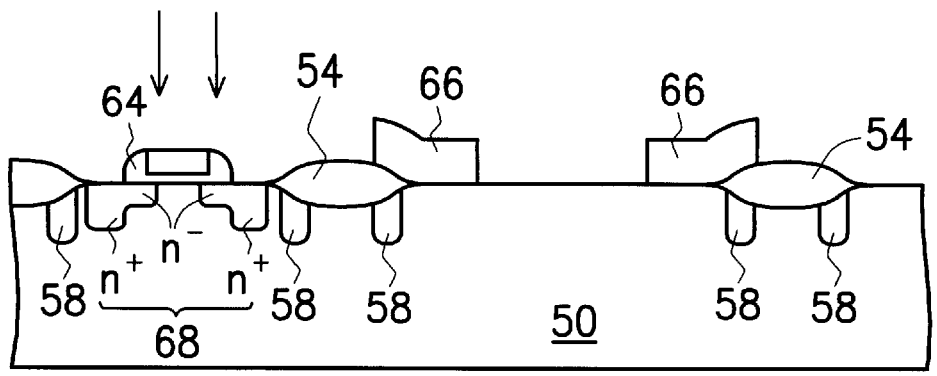
Figure 3E:
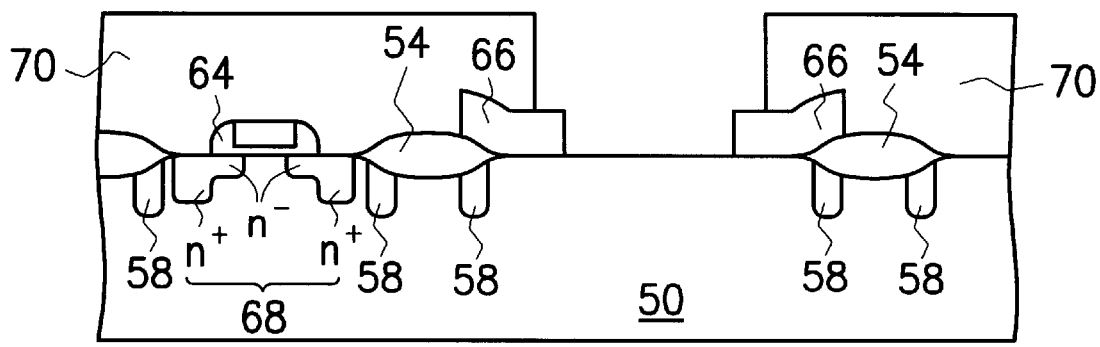
Figure 3F:
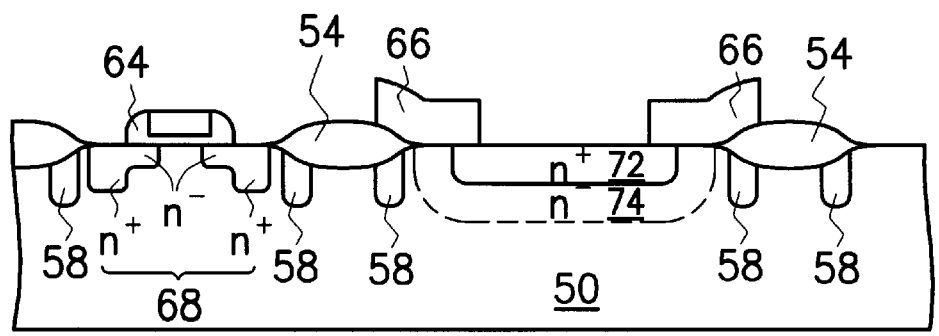

As shown in FIG. 3B, a patterned photoresist layer 62 is formed around the edge (covering a portion of the isolation region as well) of the sense region 56, which is the desirable location for the silicon dioxide outer ring. As shown in FIG. 3C, a spacer etching is carried out. Hence, spacers 64 are formed in the device region 52, and a silicon dioxide ring 66 is formed over the junction region between the isolation region 54 and the CMOS sense region 56. As shown in FIG. 3D, a source/drain implant is carried out to form surrounding device structures 68 in the device region 52. To prepare for ion implantation, an opening is formed in the sense region by forming a photoresist layer 70 over other regions (for example, the device region 52 and the isolation region 54), as shown in FIG. 3E. An implantation is carried out by implanting ions into the sense region with a tilt angle, as shown in FIG. 3F. For example, a n⁺ implant and a n⁻ implant are sequentially conducted to form an n⁺ region 72 and the an n⁻ region 74. The regions 72 and 74 together form the sensor diode of a CMOS sensor.

In this invention, the silicon dioxide outer ring is formed over the junction region between the sense region and the isolation region before carrying out spacer etching. Hence, any damaging effect on the sensor diode due to etching is minimized, and surface leakage is greatly reduced.

In addition, since the silicon dioxide outer ring is formed before carrying out tilt-angle implant of ions into the sense region to form the n⁺ and the n⁻ regions, the junction surface of the sensor diode is closer to the surface. Therefore, the distance between junction surfaces for the n+/n−/field implant regions is increased, leading to a further reduction of current leak from the junctions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A CMOS sense structure having a silicon dioxide outer ring around the sense region, comprising:

a substrate;

a n⁻ region in the substrate;

a n⁻ region within the n⁻ region of the substrate;

an isolation region in the substrate in contact with the edge of the n⁻ region;

a field implant region under the isolation region; and a silicon dioxide outer ring over the n⁻ region, a portion of the isolation region and a portion of the n⁺ region.

2. The structure of claim 1, wherein material forming the isolation region includes silicon dioxide.

3. The structure of claim 1, wherein the field implant region includes a P-type ion implant region.

4. A CMOS sense structure having a silicon dioxide outer ring around the sense region, comprising:

a substrate;

a n⁻ region in the substrate;

a n⁺ region within the n⁻ region of the substrate;

an isolation region in the substrate in contact with the edge of the n⁻ region;

a field implant region under the isolation region; and an outer ring formed on the n⁻ region, a portion of the isolation region and a portion of the n⁺ region, wherein the n⁺ region is separated from the isolation region.

5. The structure of claim 4, wherein a material for forming the isolation region includes silicon dioxide.

6. The structure of claim 4, wherein the outer ring is a silicon dioxide outer ring.

* * * * *